United States Patent [19]

Maniwa et al.

[11] Patent Number: 4,872,091
[45] Date of Patent: Oct. 3, 1989

[54] MEMORY CARTRIDGE

[75] Inventors: Yoshio Maniwa; Takashi Morita, both of Yokohama; Masaichi Niro, Kawasaki; Daisuke Abe, Misato; Haruhiko Nagayama, Tokyo, all of Japan

[73] Assignee: Ricoh Company, Ltd., Tokyo, Japan

[21] Appl. No.: 73,714

[22] Filed: Jul. 15, 1987

[30] Foreign Application Priority Data

Jul. 21, 1986 [JP] Japan .................. 61-172492
Jul. 21, 1986 [JP] Japan .................. 61-172493

[51] Int. Cl.$^4$ ............................................. H05K 9/00
[52] U.S. Cl. .................................... 361/424; 174/51; 361/395; 361/399
[58] Field of Search ............... 174/35 R, 35 C, 51; 361/391–395, 399, 413, 415, 424; 439/92, 607–610; 235/441, 492

[56] References Cited

U.S. PATENT DOCUMENTS

| 4,381,129 | 4/1983 | Krenz | 439/607 |
| 4,386,814 | 6/1983 | Asick | 439/607 |
| 4,457,575 | 7/1984 | Davis et al. | 439/610 |
| 4,521,062 | 6/1985 | Kurbikoff et al. | 439/92 |
| 4,602,164 | 7/1986 | Gore, III et al. | 361/424 |

OTHER PUBLICATIONS

"Pluggable Storage Modules", Atkinson et al., IBM Technical Disclosure Bulletin, vol. 15, No. 11, 4/73, pp. 3408–3409.
Davis, "Solid-State Cartridge System", IBM Technical Disclosure Bulletin, vol. 23, No. 5, Oct. 1980, pp. 1748–1750.

Primary Examiner—A. D. Pellinen
Assistant Examiner—Gregory D. Thompson
Attorney, Agent, or Firm—Cooper & Dunham

[57] ABSTRACT

A memory cartridge for use with a printer, a copier, a word processor and other electronic equipment as an external memory. A connector corresponding to that of the equipment is provided on one end of a casing which accommodates a printed circuit board, which is loaded with memory devices. A plurality of memory cartridges may be connected to a buffer of the equipment via the individual connectors. A grounding plate for making contact with a grounding portion of the printed circuit board is disposed on the memory cartridge close to the connector. This reliably connects the memory cartridge to ground. Further, since which one of the memory cartridges is selected can be determined, it is not necessary for the equipment to be provided with buffers and related circuits in one-to-one correspondence to the memory cartridges.

7 Claims, 13 Drawing Sheets

|  | J1 | J2 | J3 | J4 | J5 | J6 | J7 | J8 | J9 | J10 | J11 | J12 | J13 | J14 | J15 | J16 | J17 | J18 | J19 |
|---|---|---|---|---|---|---|---|---|---|---|---|---|---|---|---|---|---|---|---|
| 256Kb ROM | * | OFF | ON | * |  | ON | * |  | * |  | * |  | * |  |  | * |  | * |  |
| 512Kb ROM | OFF | ON |  | OFF |  | OFF | ON |  | * |  | * |  | * |  |  | * |  | * |  |
| 1Mb HROM/H | OFF | ON | ON | OFF | ON |  | OFF | ON | * |  | * |  | OFF | ON |  | * |  | * |  |
| 1Mb HROM/L | OFF | ON | ON | OFF | ON |  | OFF | ON | * |  | * |  | * |  |  | * |  | * |  |
| 16Kb RAM | * |  |  | * |  |  |  |  | OFF | ON | OFF | ON | * |  |  | * |  | OFF | ON |
| 64Kb RAM | * |  |  | * |  |  | * |  | * |  | * |  | * |  |  | OFF | ON | OFF | ON |
| 256Kb RAM | * |  |  | * |  |  | * |  | * |  | * |  | * |  | ON | ON | OFF | OFF | ON |

MEMORY CARTRIDGE

BACKGROUND OF THE INVENTION

The present invention relates to a memory cartridge and, more particularly, to a memory cartridge which is applicable to a printer, a copier, a word processor and other electronic equipments as an external memory.

Today, word processors, personal computers and other electronical equipments are extensively used in various fields and required to be furnished with a variety of functions. In a printer, for example, there is a demand for many different fonts and special formats. Installing all the desired functions in the body of a word processor, a printer or the like to meet such a demand is not cost-effective and is impracticable. In the light of this, there has been proposed a memory cartridge in which memory devices each storing a certain function (e.g. a program of fonts or formats) are installed in a casing. The memory cartridge is readily connectable to a word processor, a printer and others by way of a connector. A problem with such a memory cartridge is how to enhance the stability of operation thereof, because the memory cartridge is connected to an equipment through a connector as stated.

From the standpoint of applicable range of a memory cartridge and, therefore, the effective use of an equipment itself, it is desirable that a plurality of independent memory cartridges be connectable to an equipment in parallel with each other. Heretofore, however, an effort to load an equipment with a plurality of memory cartridges has resulted in the need for buffers and other devices which are built in the equipment, one for each of the memory cartridge, inviting an increase in cost.

SUMMARY OF THE INVENTION

It is, therefore, an object of the present invention to provide a memory cartridge which allows data to be selectively read out of a plurality of memory cartridges without resorting to buffers and related circuits which would be otherwise provided in one-to-one correspondence to the memory cartridges.

It is another object of the present invention to provide a memory cartridge which sets up a reliable connection to ground to thereby enhance positive operation.

It is another object of the present invention to provide a generally improved memory cartridge.

A memory cartridge for use with an electronic equipment as an external memory of the present invention comprises a casing for storing memory devices, a connector provided on the casing and having a plurality of connecting pins at a front end thereof, and a grounding plate covering an upper and a rear surface of the connector and having a predetermined area which constitutes a part of the external surface of the casing.

The above and other objects, features and advantages of the present invention will become more apparent from the following detailed description taken with the accompanying drawings.

DESCRIPTION OF THE PREFERRED EMBODIMENT

Referring to FIGS. 1 to 12, a memory cartridge embodying the present invention is shown. The memory cartridge in accordance with this embodiment is applied to a laser printer to serve as a memory cartridge for fonts by way of example.

Figure 1:
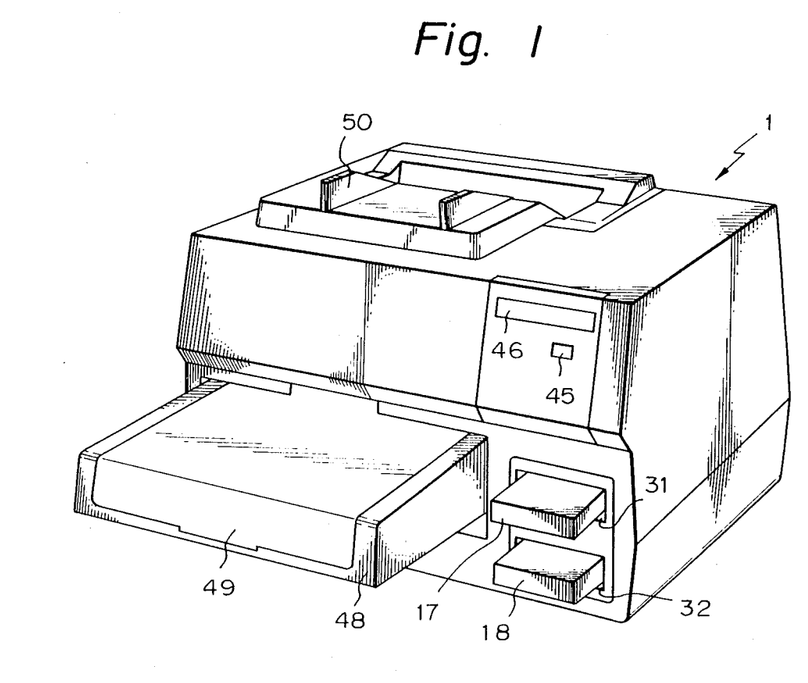
FIG. 1 is a perspective view of a laser printer which uses the invention.
Figure 2:
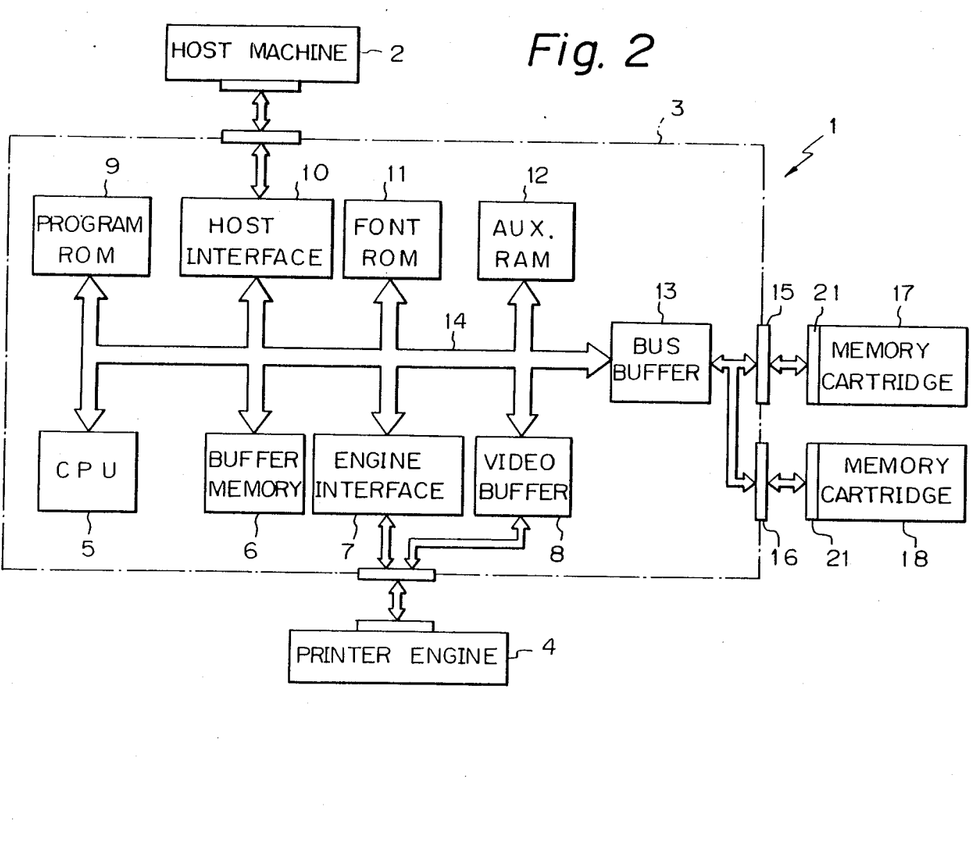
FIG. 2 is a block diagram of the laser printer.

In FIG. 1, the laser printer 1 is connected to a host computer or like host machine 2, FIG. 2, to play the role of a terminal. As shown in FIG. 2, the laser printer 2 includes a controller 3 which is adapted to convert a character code fed thereto from the host machine 2 into a character dot pattern and, then, feeds it to a printer engine 4 as a serial video signal. The printer engine 4 has a laser optics section, a photoconductive element, a charging section, a developing section, a transferring section, a fixing section and others, and prints out a character based on the serial video signal which is output by the controller 3.

The controller 3 includes a 16-bit CPU (e.g. Intel 80186 or Motorola 68000) 5, a buffer memory 6, an engine interface 7, a video buffer 8, a program ROM 9, a host interface 10, a font ROM 11, an auxiliary RAM 12, a bus buffer, and the like, which are interconnected by a bus 14. Via the host interface 10, the controller 3 receives a character code, a control code, a control command and image data from the host machine 2 while delivering a printer status to the host machine 2.

Two memory cartridges 17 and 18 are removably connected to, respectively, connectors 15 and 16 which are in turn connected to the bus buffer 13 in parallel with each other. In this manner, the laser printer 1 provided with a single bus buffer 13 and not bus buffers each being associated with a respective one of the memory cartridges 17 and 18. As will be described in detail later, the memory cartridges 17 and 18 may individually be used to store font pattern data and graphic segment data, to hold form data and graphic data which are fed from the host machine 2, and to store programs for driving the laser printer 1. While the bus 14 of the CPU ia made up of sixty-four buses, fourteen of them are adapted for the expansion of the functions and fifty of them are connected to the bus buffer 13.

The CPU 5 executes programs stored in the program ROM 9 to operate the laser printer 1. The buffer memory 6 stores on one page basis the data which are sent from the host machine 2 via the host interface 10 or, when the data is a character code, stores the data together with those informations which are representative of print positions and fonts. The engine interface 7 controls the execution of print-out by checking the status of the printer. The video buffer 8 transfers to the printer engine 4 graphic pattern data on a block basis in response to the font and print position informations. The font ROM 11 stores therein several kinds of front data patterns and graphic segment data which are frequently used. The auxiliary RAM 12 serves to temporarily store data which may be fed from the host machine 2 and the memory cartridges 17 and 18.

Figure 3:
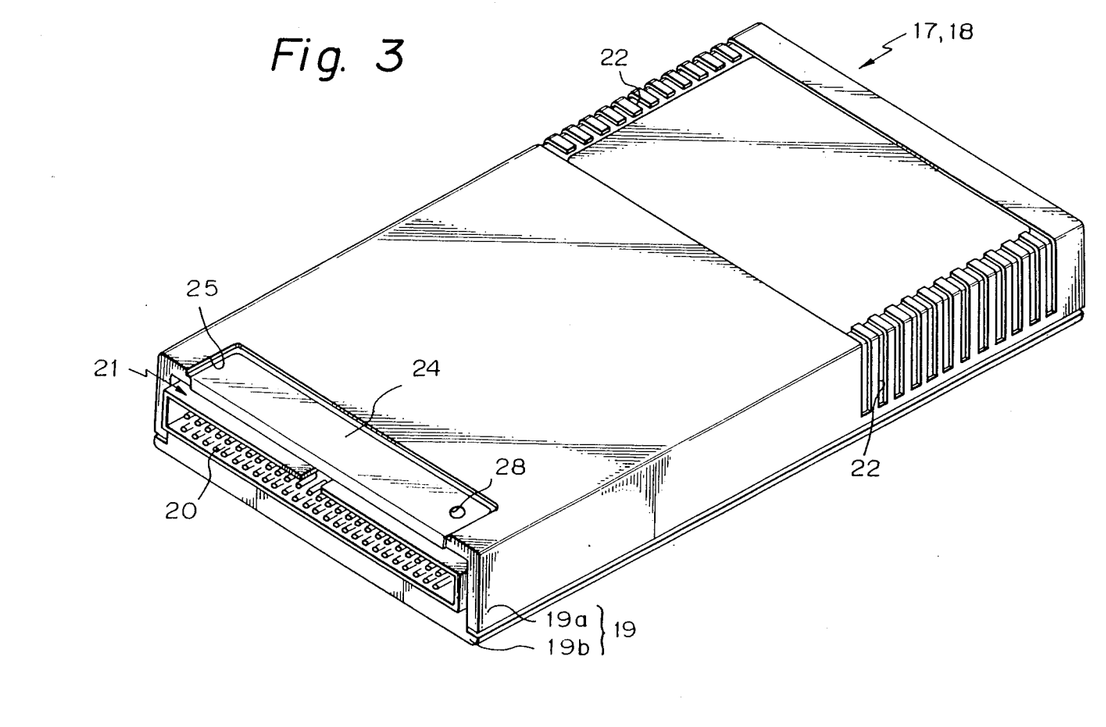
FIG. 3 is a perspective view of a memory cartridge in accordance with the present invention.
Figure 4:
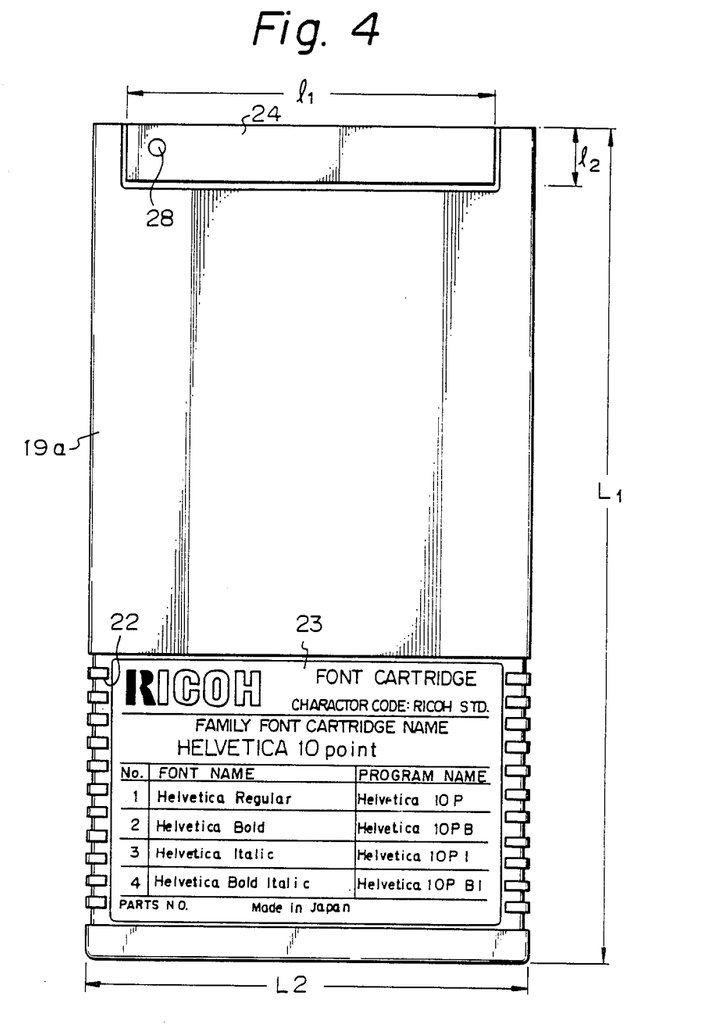
FIG. 4 is a top plan view of the memory cartridge.
Figure 5:
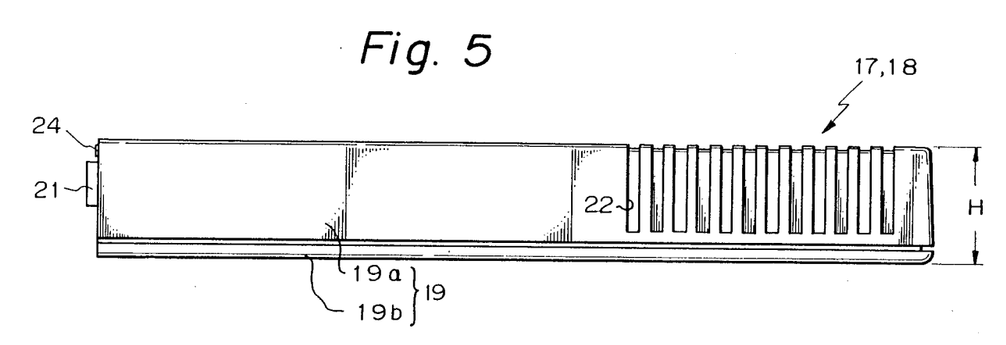
FIG. 5 is a side elevation of the memory cartridge.
Figure 6:
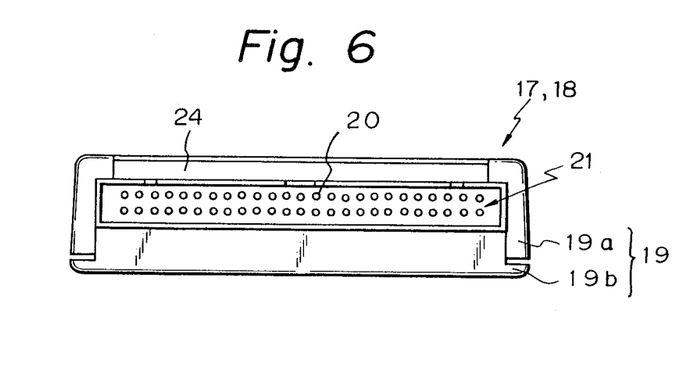
FIG. 6 is a front view of the memory cartridge.
Figure 7:
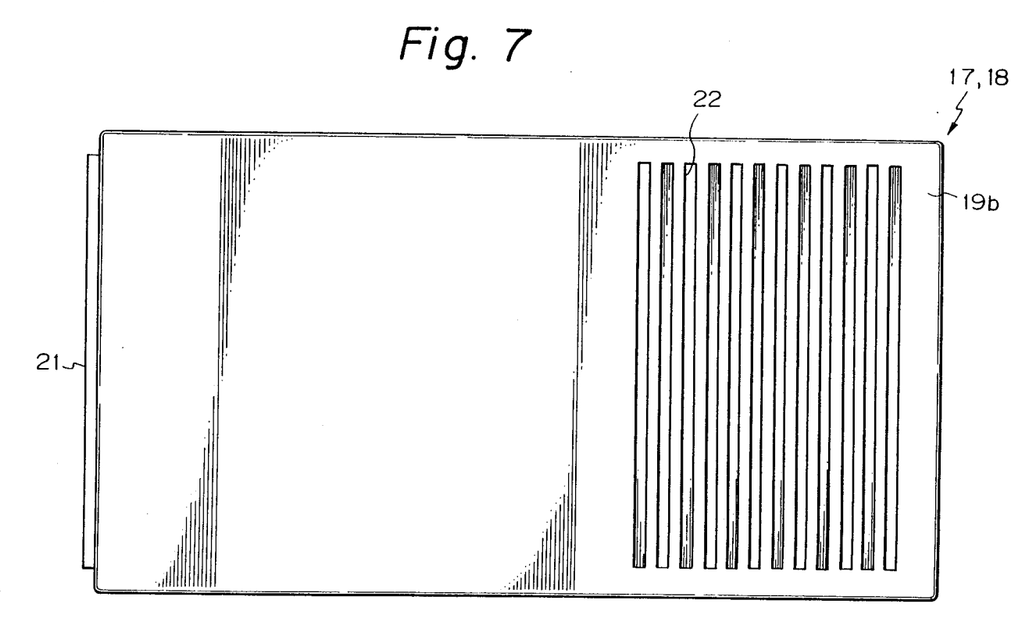
FIG. 7 is a rear end view of the memory cartridge.

As shown in FIGS. 3 to 7, each of the memory cartridges 17 and 18 comprises a generally rectangular casing 19 in which memory devices are installed. As best shown in FIG. 6, the casing 19 is provided on one end thereof with a connector 21 which has a plurality of pins 20, fifty pins in this particular embodiment. The end of the casing 19 which is provided with the connector 21 as stated will hereinafter be referred to as a front end for convenience. The casing 19 has a dimension (length) $L_1$ of 145 millimeters in the longitudinal direction, a dimension (width) $L_2$ of 80 millimeters in the lateral direction, and a height H of 20 millimeters. The casing 19 is made up of an upper casing part 19a and a lower casing part 19b. As shown in FIGS. 5 and 7, a plurality of anti-slip grooves 22 are provided in a rear portion of the casing 19 to extend along the width on the rear surface of the casing 19 and along the height on the opposite sides of the same. The grooves 22 are distributed over a dimension of 46 millimeters in the longitudinal direction of the casing 19. As shown in FIG. 4, the anti-slip grooves 22 are also provided in the marginal portions of the upper surface of the casing 19, but not in the central portion. Adhered to the central portion mentioned, a label 23 is provided with various legends such as RICOH, a manufacturer's name from which the memory cartridges 17 and 18 are available, and the names of software stored in the memory cartridge.

Figure 8:
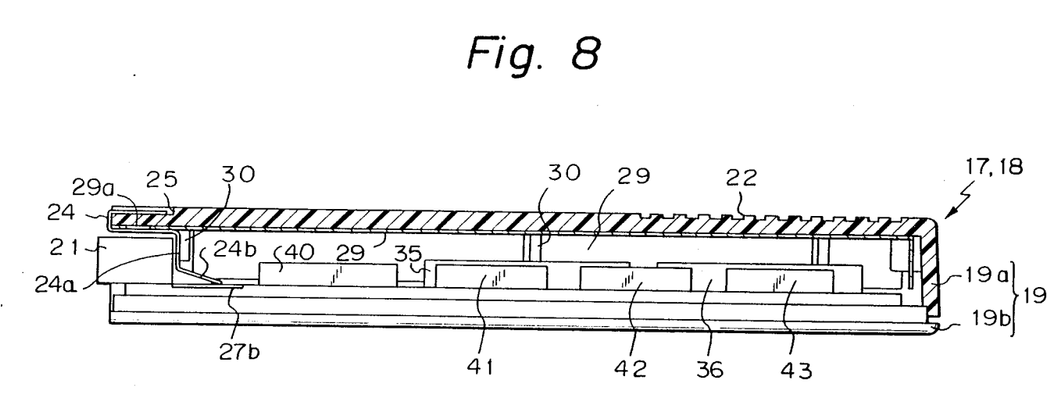
FIG. 8 is a sectional side elevation of the memory cartridge.
Figure 10:
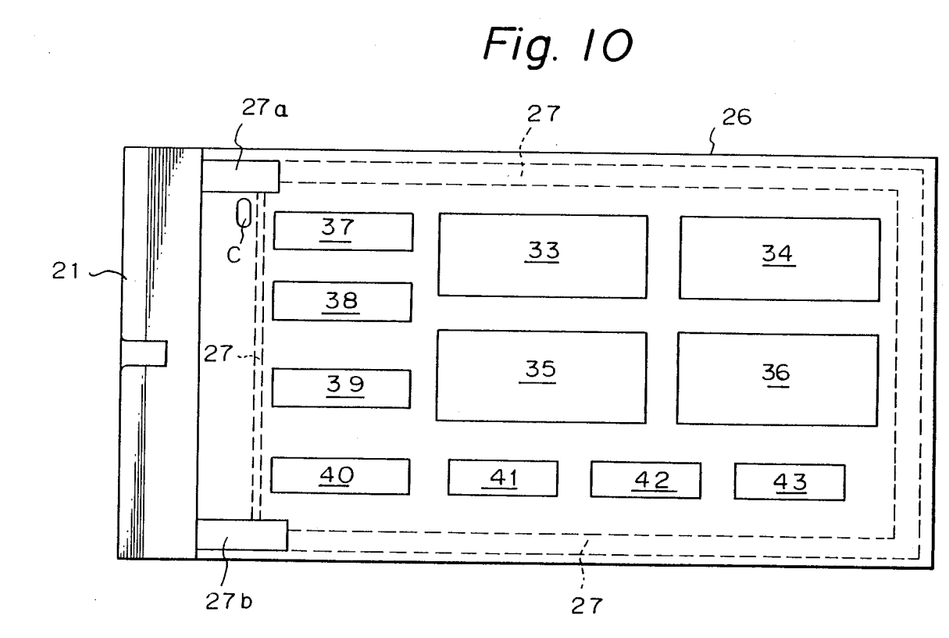
FIG. 10 is a top plan view of a printed circuit board of the memory cartridge.

As shown in FIGS. 3, 4 and 6, a grounding plate 24 is mounted on an upper front portion of the casing 19. As shown in FIG. 8, the grounding plate 24 includes a generally U-shaped bend which is fitted in a recess 25 of the casing 19, and a downward extension emerging at a right angle from the U-shaped bend inside of the casing 19. The downward extension 24a of the grounding plate 24 is engaged with the back of the connector 21, preventing the grounding plate 24 from slipping off the casing 19. At opposite sides of the grounding plate 24, the downward extension 24a merges into pawls 24b and 24c which are bent downward into the casing 19. As shown in FIG. 10, the pawls 24b and 24c are adapted to make contact with a wiring 27 for grounding which is provided on a printed circuit board 26. Specifically, the printed circuit board 26 carries wirings on both surfaces thereof and are shielded by an insulator. The grounding wiring 27 provided on the front surface of the printed circuit board 26 extends along the edges of the board 26. Both ends of the wiring 27 adjacent to the connector 21 are not shielded by the insulator, i.e., they are uncovered and exposed to the outside, as indicated by 27a and 27b. The pawls 24b and 24c of the grounding plate 24 are pressed against, respectively, the uncovered portions 27a and 27b of the wiring 27. In this configuration, the plate 24 is electrically connected to the wiring 27 on the printed circuit board 26.

A capacitor C is positioned on the printed circuit board 26 close to the uncovered portion 27a of the wiring 27 for a circuit layout reason. While the pawl 24c which makes contact with the uncovered portion 27a should preferably be wide for reliable grounding, it in this particular embodiment is shaped narrower than the other pawl 24b to be prevented from interfering with the capacitor C. The grounding plate 24 is produced by punching and, then, bending a nickel-plated phosphor bronze sheet. Since the bending direction available is limited due to the difference in width between the pawls 24b and 24c, the ground plate 24 is provided with a positioning hole 28. The positioning hole 28 serves not only to restrict the setting direction of the punched workpiece but also to enhance the setting accuracy of the workpiece to a machine, thereby promoting the accuracy of machining.

Figure 9:
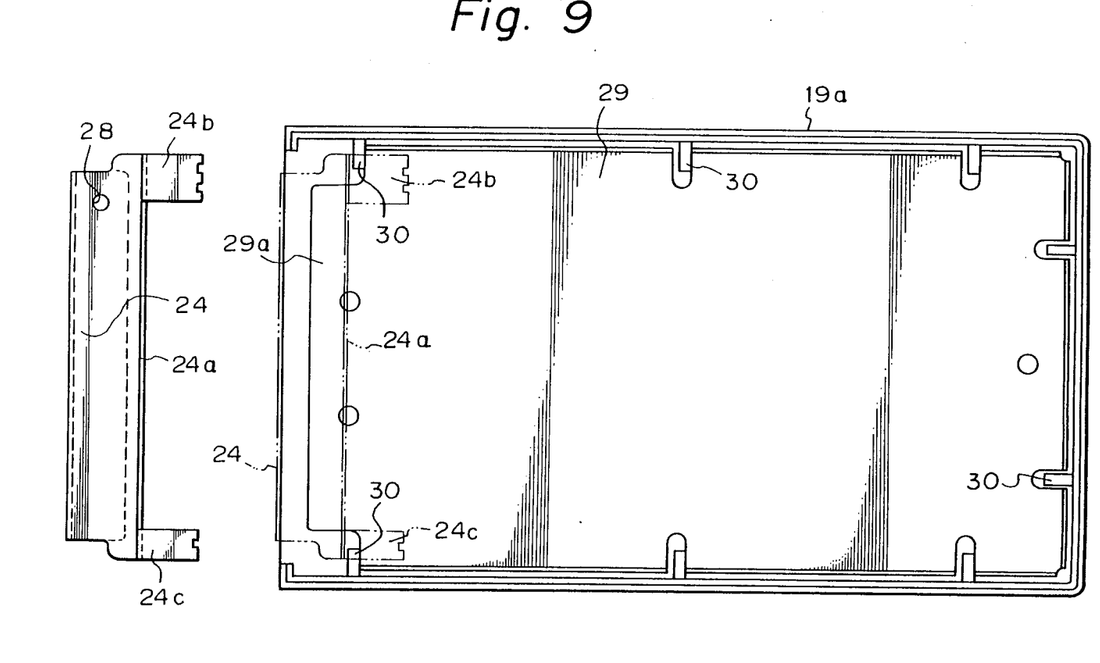
FIG. 9 is a view showing internal surfaces of a grounding plate and an upper casing part of the memory cartridge.

As shown in FIGS. 8 and 9, a shield plate 29 is provided on the inner surface of the upper casing part 19a in such a manner as to cover substantially the whole area of the latter. A tongue 29a extends forward from the shield plate 29 so that, as shown in FIG. 8, the shield plate 29 makes contact with the ground plate 24 through the tongue 29a. Formed of a nickel-plated phosphor bronze sheet, the shield plate 29 function to shield electromagnetic waves radiating from the circuit elements of the memory cartridge 17 or 18 and, also, to intercept externally derived noise due to static electricity. A number of ribs 30 are provided on the inner surface of the upper casing part 19a including those portions which face the back of the pawls 24b and 24c. In this construction, when the connector 21 is inserted into the connector 15 or 16, the ribs 30 support the connector 21 to eliminate incomplete contact of the connector 21 with the printed circuit board 26. Specifically, as shown in FIG. 1, the laser printer 1 is provided with two slots 31 and 32 one above the other. When any of the memory cartridges 17 and 18 is inserted into any of the slots 31 and 32, the connector 21 of the memory cartridge is brought into connection with the connector 15 or 16 inside of the slot. In this instance, while the memory cartridge 17 or 18 is forced into the slot 31 or 32 by a substantial force, the connection of the connector 21 with the printed circuit board 26 is insured because the connector 21 is supported by the ribs 30, as shown in FIG. 8.

A grounding plate, not shown, is disposed in each of the slots 31 and 32 of the laser printer 1 close to the connector 15 or 16 in such a manner as to make contact with the grounding plate 24 of the memory cartridge 17 or 18 when the latter is loaded. These grounding plates are individually connected to a panel of the laser printer 1 having a substantial capacity, e.g. a side panel or a base panel. That portion of the grounding plate 24 which shows itself on the outer surface of the casing 19 has a wide area, i.e., a widthwise dimension $l_1$ of 65 millimeters and a longitudinal dimension $l_2$ of 11.6 millimeters. This allows the grounding plate 24 to make contact with the grounding plate of the laser printer 1 over a substantial area.

Figure 11A:
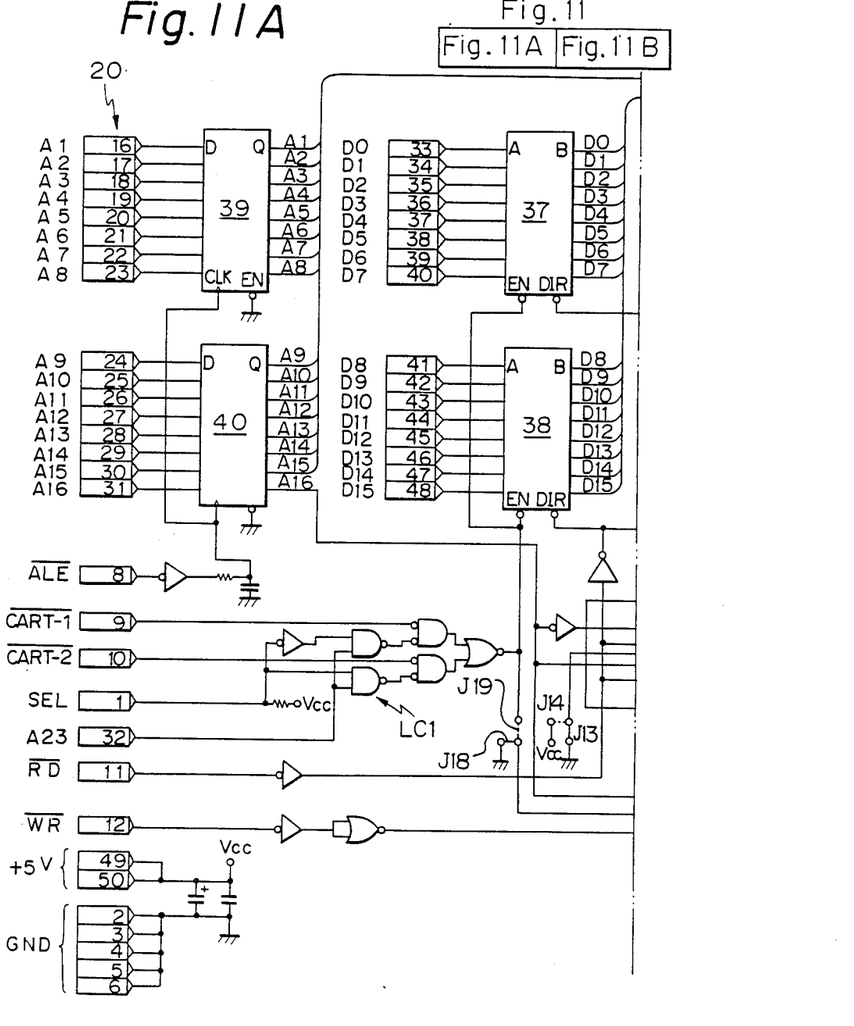
FIGS. 11A and 11B, which fit together as shown in FIG. 11 are a circuit diagram of the memory cartridge.
Figure 11B:
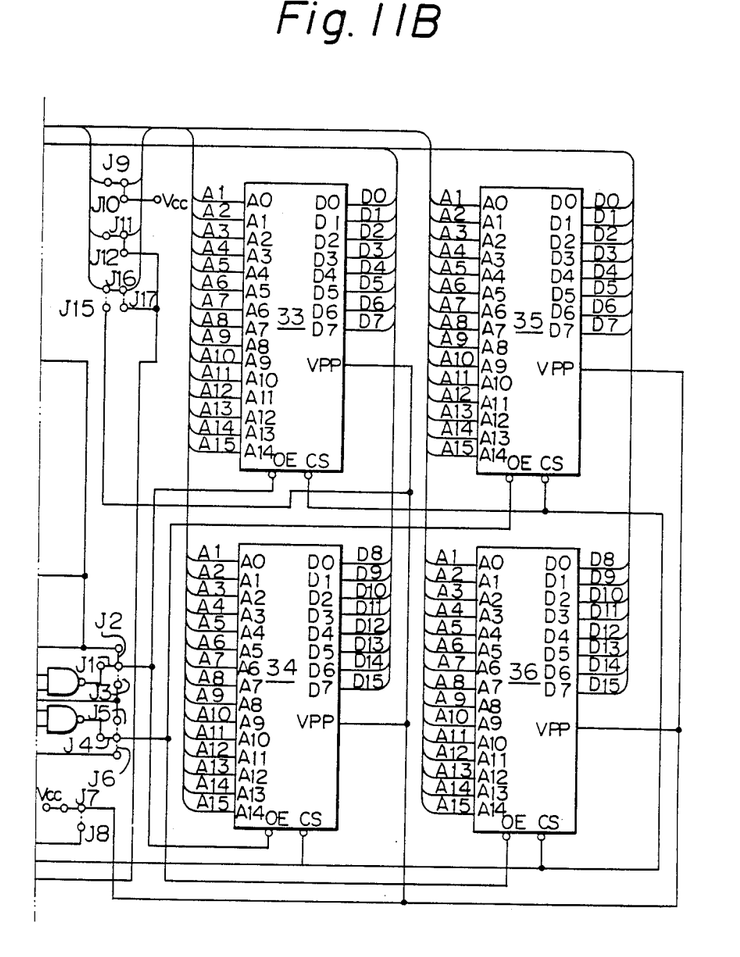

As shown in FIG. 10, the printed circuit board 26 is loaded with four ROMs 33, 34, 35 and 36, four buffers 37, 38, 39 and 40, and three control ICs (integrated circuits) 41, 42 and 43. These devices are connected to the pins 20 of the connector 21 by wirings which are printed on both surfaces of the printed circuit board 26. Each of the ROMs 33, 34, 35 and 36 is implemented with Intel 27256 having a capacity of 256 Kb (kilobits) and 28 pins. As shown in FIG. 11, the ROMs 33 and 34 are paired, and the ROMs 35 and 36 are paired, because the CPU 5 of the controller 3 is implemented with a 16-bit CPU Data lines $D_0$ to $D_7$ are connected to the data pins $D_0$ to $D_7$ of each of the ROMs 33 and 35 while data lines $D_8$ to $D_{15}$ are connected to the data pins $D_0$ to $D_7$ of each of the ROMs 34 and 36.

The data lines $D_0$ to $D_7$ are connected to the data buffer 37, and the data lines $D_8$ to $D_{15}$ are connected to the data buffer 38. The buffer 37 is connected to the thirty-third pin 20 to the fortieth pin 20 of the connector 21 while the buffer 38 is connected to the forty-first pin 20 to the forty-eighth pin 20 of the connector 21. Address lines $A_1$ to $A_{15}$ are connected to address pins $A_6$ to $A_{14}$ of the ROMs 33, 34, 35 and 36. The address lines $A_1$ to $A_8$ are connected to the address buffer 39, and the address lines $A_9$ to $A_{15}$ are connected to the address buffer 40. Connected to the buffer 40 is an address line $A_{16}$ which is adapted to control an H (high potential)/L (low potential) signal fed to an OE (Output Enable) terminal of each of the ROMs 33, 34, 35 and 36. The buffer 39 is connected to the sixteenth pin 20 to the twenty-third pin 20 of the connector 21 while the buffer 40 is connected to the twenty-fourth pin 20 to the thirty-first pin 20 of the connector 21. Applied to the eighth pin of the connector 21 is an ALE (Address Latch Enable) signal. The ALE signal is fed to CLK (clock) terminals of the buffers 39 and 40. Signals CART-1 and CART-2 showing which one of the memory cartridges 17 and 18 loaded in the slots 31 and 32 is to be controlled by the CPU 5 are fed to, respectively, to the ninth and tenth pins 20 of the connector 21 in response to the H/L signal. The eleventh pin 20 is connectd to an SEL (select) terminal of each of the connectors 15 and 16 of the controller 3. The SEL terminal of the connector 15 is connected to ground while that of the connector 16 is open-circuited.

The ninth to eleventh pins 20 are connected to EN (Enable) terminals of the buffers 37 and 38 via a logic circuit LC1 which is constituted by the control ICs 41 to 43. Hence, the data output by the buffers 37 and 38 can be controlled by causing the CPU 5 of the controller 3 to set the CART-1 and CART-2 signals to H or L. This allows data stored in the memory cartridges 17 and 18 to be selectively read out as required. Specifically, the ninth and tenth pins 20 are adapted to determine which one of the cartridges 17 and 18 is selected.

The thirty-second pin of the connector 21 is connected to the logic circuit LC1 so as to detect the memory cartridges 17 and 18 which may be inserted in the slots 31 and 32. Applied to the eleventh and twelfth pins of the connector 21 are signals which show if data should be read (RD) or written (WR). The twelfth pin 20 is used when the ROMs 33, 34, 35 and 36 are replaced with RAMs. While a +5-volt power supply is connected to the forty-ninth and fiftieth pins 20, the second to sixth pins 20 are adapted for grounding. In this embodiment it is not that the power supply pin and the ground pins 20 are implemented with one particular pin each, but that the pins other than those used for address, data and control are available for power supply and grounding. Hence, power can be supplied via a plurality of pins and, in addition, the laser printer can be connected to ground via a plurality of pins 20. This enhances stable operation of the memory cartridges 17 and 18.

As shown in FIGS. 3 and 6, fifty pins 20 are arranged in two arrays in the connector 21. Specifically, the odd pins, i.e., first to forty-ninth pins are arranged in this sequence from the upper right corner as viewed in the drawings while the even pins, i.e., second to fiftieth pins are arranged below the first to forty-ninth pins, respectively. Hence, the power supply pins 20 and the ground pins 20 are collectively disposed at the left end and the right end, respectively. While the grounding wiring 27 is laid on the front surface of the printed circuit board 26, a power supply wiring, not shown, is laid on the rear surface of the same. Such a configuration renders the print layout on the printed circuit board 26 simple and neat.

Four different kinds of font pattern data printed on the label 23 as shown in FIG. 4 are individually stored in the ROMs 33, 34, 35 and 36. Those data allow the laser printer 1 to print out characters in a variety of fonts. Specifically, while the font ROM 11 of the controller 3 which is built in the laser printer 1 stores several kinds of font pattern data and graphic segment data of frequent use, characters may be printed out in any font other than those stored in the font ROM 11 by reading data of the desired font out of the memory cartridge 17 or 18. It is to be noted that the data stored in the ROMs 33, 34, 35 and 36 are not limited to font pattern data and may be graphic segment data and picture data or even predetermined programs for causing the laser printer 1 to serve as a daisy printer or a dot printer.

Figure 12:
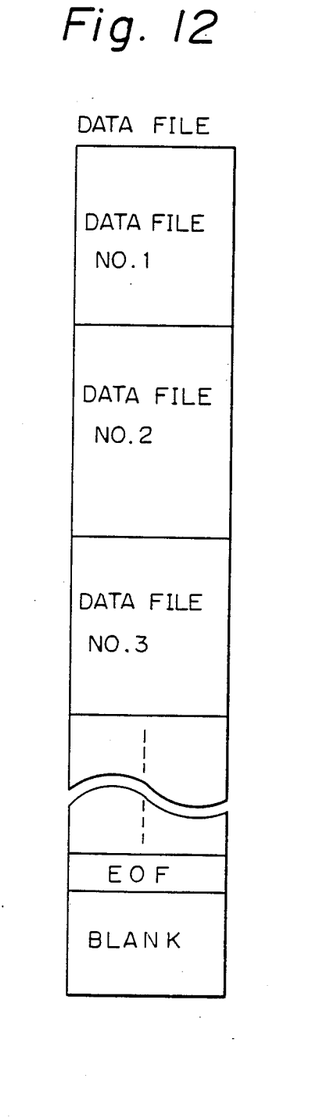
FIG. 12 is a map showing data files which are stored in each memory device of the memory cartridge.

As shown in FIGS. 8 and 12, the ROMs 33, 34, 35 and 36 of each of the memory cartridges 17 and 18 individually store several different kinds of data in a sequential pack of No. 1 data file, No. 2 data file, No. 3 data file and so on. This promotes effective use of the capacity of the ROMs 33, 34, 35 and 36. The selection of any of the data stored may be effected by the host machine 2, in which case the CPU 5 searches the memory cartridges 17 and 18 in response to a command, or by a person who may manipulate a select button 45 which is provided on the front panel of the laser printer 1, as shown in FIG. 1. The file name of a data file selected appears on a liquid crystal display 46 of the laser printer 1.

In FIG. 1, the reference numeral 48 designates a cassette which the paper sheets 49 printed with information are discharged. In FIGS. 11A and 11B, labeled $J_1$ to $J_{19}$ are connections by jumper wires. When the 256-Kb ROMs 33, 34, 35 and 36 are replaced with 512-Kb ROMs, 1-Mb (megabit) MROMs (mask ROMs), RAMs and others, the jumper wire connections are switchable to readily set up wirings which match to those memories.

In operation, the laser printer 1 processes data fed from the host machine 2 by the controller 3 and causes the printer engine 4 to print out the data on the paper sheet 49. The data from the host machine 2 may sometimes be a serial video signal and sometimes a JIS code or like character code. In the case of a serial video signal, every time one page of data are lodged in the buffer memory 6, they are transferred in a block to the printer engine 4 via the video buffer 8 so as to be printed out on the paper 49. In the case of a character code, on the other hand, the data are stored in the buffer memory 6 with print position information and font information added thereto; every time one page of data are stored in the buffer memory 6, print positions are lodged in the video buffer 8 while, at the same time, font data pattern are read out of the font ROM 11 on a character-by-character basis and also lodged in the video buffer 8.

As stated earlier, the font ROM 11 stores font data pattern which are frequently used. When a font other than those stored in the font ROM 11 is specified, whether or not the memory cartridge 17 and/or memory cartridge 18 loaded in the slot 31 or 32 stores the specified font is determined. Depending upon which one of the memory cartridges 17 and 18 stores the desired character font, the signals CART-1 and CART-2 are controlled to transfer the data from the memory cartridge 17 or 18, which stores the desired font, to the auxiliary RAM 12 via the bus buffer 13. The signals CART-1 and CART-2 render the EN terminals of the buffers 37 and 38 of the memory cartridges 17 and 18 H or L to control the output of data.

In this manner, the signals CART-1 and CART-2 are controlled to selectively operate the memory cartridges 17 and 18 which are connected to the bus buffer 13 in parallel with each other, thereby reading out data of the desired font. That is, desired data can be read out of one of the cartridges 17 and 18 by means of a single bus buffer 13, i.e., without resorting to bus buffers otherwise installed in one-to-one correspondence to the memory cartridges. This contributes a great deal to the cut-down of cost of the laser printer 1.

After the data of desired font have been transferred from the memory cartridge 17 or 18 to the auxiliary RAM 12, print positions and font pattern data are stored in the video buffer 8 when one page of data from the host machine 2 are lodged in the buffer memory 6. Then, the data are fed in a block from the video buffer 8 to the printer engine 4 to be printed out on the paper 49. As previously stated, each of the memory cartridges 17 an 18 loaded in the slot 31 or 32 has the wide ground plate 24 on its surface. Hence, when the memory cartridge 17 or 18 is inserted into the slot 31 or 32, the grounding plate 24 is brought into contact with the large-capacity grounding plate of the laser printer 1 to be thereby connected to ground. Further, since the grounding plate 24 is held in contact with the shield plate 29 and the grounding wiring 27 provided on the printed circuit board 26, the shield plate 29 and grounding wiring 27 are connected to ground by way of the wide grounding plate 24 and large-capacity grounding plate. As a result, the radiation of electromagnetic waves from the memory cartridges 17 and 18 is eliminated and, yet, the influence of externally derived noise due to static electricity is precluded. These features, coupled with the reliable connection of the printed circuit board 26 to ground, allows the memory cartridges 17 and 18 to be operated stably.

Figure 13:
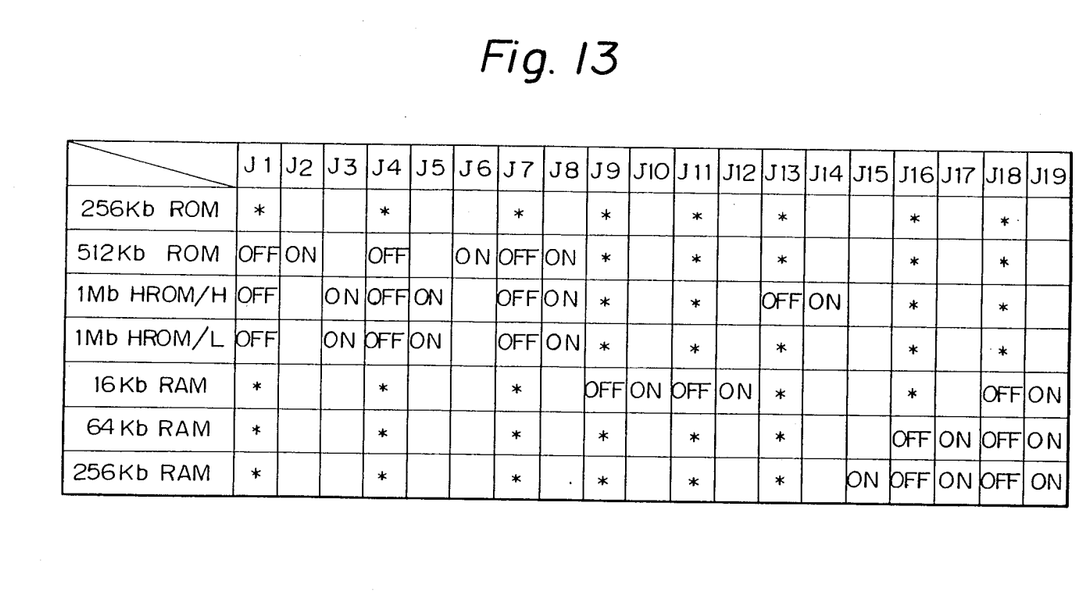
FIG. 13 is a table showing conditions of connection of jumper wires corresponding to various kinds of memory devices.

The four 256-Kb ROMS 33, 34, 35 and 36 which are installed in each of the memory cartridges 17 and 18 may be replaced with 512-Kb ROMs or even 1-Mb MROMs. Such replacement is readily implemented with the jumper wires $J_1$ to $J_{19}$ of FIGS. 11A and 11B, as previously described. Specifically, the connections of the jumper wires $J_1$ to $J_{19}$ are switched as shown in FIG. 13. In FIG. 13, the jumper lines $J_1$ to $J_{19}$ with asterisks are in connection, those with "OFF" are disconnected, and those with "ON" are connected. For example, when 256-Kb ROMs 33 to 36 are mounted, the jumper wires with asterisks $J_1$, $J_4$, $J_7$, $J_9$, $J_{11}$, $J_{13}$, $J_{16}$ and $J_{18}$ are in connection, but when 512-Kb ROMs are mounted the jumper wires $J_1$, $J_4$ and $J_7$ are disconnected with the jumper wires $J_2$, $J_6$ and $J_8$ newly connected.

As regards 1-Mb MROM, two MROMs will be mounted because the CPU 5 of the controller 3 has sixteen bits and, therefore, the storage capacity usable is 128 K bytes. In this case, while two MROMs are used in a pair because the CPU 5 has 16 bits and an MROM has eight data pins, the accessible storage capacity is 128 K bytes which is substantially one half the capacity of one MROM. However, to effectively use MROMs, the two MROMs may be individually loaded with necessary data, and the connections of the jumper wires $J_1$ to $J_{19}$ may be selectively switched based on the particular MROM which is to be used, as represented by MROM/H and MROM/L in FIG. 13.

The jumper wires which are used in this embodiment to match the wirings to a particular kind of memory devices may be replaced with switches such as dip switches.

In the case that the memory devices are implemented with RAMs, the memory cartridges 17 and 18 may be used as auxiliary RAMs, i.e., data in the controller 3 may be downloaded to the memory cartridges 17 and 18 and read out of the latter to be used.

In summary, it will be seen that the present invention surely connects a memory cartridge to ground and, thereby, promotes positive operation of a memory cartridge.

Further, since the present invention is capable of determining which one of a plurality of memory cartridges is selected, it is not necessary for an electronic equipment, to which the memory cartridges may be connected, to be provided with buffers and related circuits in one-to-one correspondence to the memory cartridges. This considerably cuts down the cost of such an electronic equipment.

Various modifications will become possible for those skilled in the art after receiving the teachings of the present disclosure without departing from the scope thereof.

What is claimed is:

1. A memory cartridge for use with electronic equipment as an external memory, comprising:
    a casing for storing memory devices, said casing comprising an upper casing part and a lower casing part, and said upper casing part having an inner surface;
    a connector provided on said casing and having a plurality of connecting pins at a front end of said connector;
    a grounding plate covering an upper and a rear surface of said connector, said grounding plate having a predetermined area which constitutes a part of an external surface of said casing; and
    a shield plate provided on said inner surface of said upper casing part and comprising a tongue for making contact with said grounding plate.

2. A memory cartridge as claimed in claim 1, wherein said connector comprises a pin for carrying a signal determining if the memory cartridge is selected for operation.

3. A memory cartridge as claimed in claim 1, wherein said grounding plate comprises an elongate extension which is bent at a right angle and engaged with said rear surface of said connector, and pawls provided at opposite sides of said elongate extension.

4. A memory cartridge as claimed in claim 3, wherein said pawls are different in width from each other.

5. A memory cartridge as claimed in claim 3, further comprising a printed circuit board having said memory devices mounted thereon, said printed circuit board including uncovered portions for grounding, said pawls of said grounding plate individually making contact with said uncovered portions.

6. A memory cartridge as claimed in claim 1, wherein said upper casing part comprises a number of ribs which are provided at a rear portion of said upper casing part.

7. A memory cartridge for use with an electronic equipment as an external memory, comprising:
   a casing for storing memory devices which have electrical grounding lines;
   a connector provided on said casing and having a plurality of connecting pins at a front end of said connector;
   a grounding plate which is provided at one side of said connector and partly overlaps said connector, said grounding plate electrically contacting said electrical grounding lines of said memory device; and
   wherein said grounding plate constitutes a part of an external top surface at a forward end of said casing.

* * * * *